United States Patent
Tashima

(10) Patent No.: US 9,788,411 B2
(45) Date of Patent: Oct. 10, 2017

(54) ELECTRONIC CONTROL UNIT

(71) Applicant: DENSO CORPORATION, Kariya, Aichi-pref. (JP)

(72) Inventor: Tsuyoshi Tashima, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 15/090,207

(22) Filed: Apr. 4, 2016

(65) Prior Publication Data

US 2016/0295682 A1 Oct. 6, 2016

(30) Foreign Application Priority Data

Apr. 6, 2015 (JP) .................................. 2015-77729

(51) Int. Cl.
H05K 7/20 (2006.01)
H05K 1/02 (2006.01)

(52) U.S. Cl.
CPC ..... *H05K 1/0209* (2013.01); *H05K 2201/066* (2013.01); *H05K 2201/1003* (2013.01); *H05K 2201/10015* (2013.01); *H05K 2201/10022* (2013.01); *H05K 2201/10053* (2013.01); *H05K 2201/1056* (2013.01); *H05K 2201/10166* (2013.01); *H05K 2201/10409* (2013.01); *H05K 2201/10545* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467

USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236

See application file for complete search history.

(56) References Cited

U.S. PATENT DOCUMENTS

| | | | | |
|---|---|---|---|---|
| 2003/0102735 A1* | 6/2003 | Asao | ....................... | H02K 5/225 310/68 D |
| 2005/0190539 A1* | 9/2005 | Watanabe | .......... | H05K 7/20854 361/704 |
| 2008/0074840 A1* | 3/2008 | Suzuki | ................. | H05K 5/0047 361/679.46 |

(Continued)

*Primary Examiner* — Anthony Haughton
*Assistant Examiner* — Razmeen Gafur
(74) *Attorney, Agent, or Firm* — Kbobbe, Martens, Olson & Bear, LLP

(57) ABSTRACT

An electronic control unit includes a substrate, an electronic component, a heat sink, a cover, a heat accumulator, and a screw. A wiring pattern is formed on the substrate. The electronic component is mounted on the substrate and generates heat upon energization thereof. The heat sink is provided on one side of the substrate in its thickness direction. The cover is made of resin and is provided on the other side of the substrate in its thickness direction. The heat accumulator is fixed to a part of the cover on the substrate-side and is in contact with a surface of the substrate on the cover-side. One end of the screw is connected to the heat sink. A central portion of the screw is inserted through a hole passing through the substrate in its thickness direction. The other end of the screw is connected to the heat accumulator.

9 Claims, 8 Drawing Sheets

(56) References Cited

U.S. PATENT DOCUMENTS

| | | | |
|---|---|---|---|
| 2009/0103267 A1* | 4/2009 | Wieland | H05K 7/20409 361/707 |
| 2010/0008048 A1* | 1/2010 | Urai | H01L 23/4006 361/717 |
| 2010/0014252 A1* | 1/2010 | Hamatani | H01G 2/106 361/707 |
| 2010/0110638 A1* | 5/2010 | Yumoto | H01L 23/367 361/709 |
| 2010/0254093 A1 | 10/2010 | Oota et al. | |
| 2010/0302737 A1* | 12/2010 | Yankoski | H01L 25/18 361/709 |
| 2011/0044005 A1* | 2/2011 | Wetzel | H05K 5/0082 361/714 |
| 2011/0170260 A1* | 7/2011 | Sarginger | B60R 16/0239 361/690 |
| 2012/0190251 A1* | 7/2012 | Akuta | B29C 45/14467 439/722 |
| 2012/0300405 A1* | 11/2012 | Weeber | H01L 23/552 361/709 |
| 2013/0003306 A1 | 1/2013 | Oota et al. | |
| 2013/0033823 A1* | 2/2013 | Nagashima | B60T 7/042 361/714 |
| 2013/0119908 A1* | 5/2013 | Harada | H02P 6/10 318/400.42 |
| 2013/0155619 A1* | 6/2013 | Bussa | H05K 5/006 361/707 |
| 2013/0335919 A1* | 12/2013 | Shinoda | H05K 5/0047 361/694 |
| 2014/0112015 A1* | 4/2014 | Kurebayashi | H05K 1/0204 362/547 |
| 2014/0225482 A1* | 8/2014 | Hara | H02K 5/22 310/68 D |
| 2014/0334104 A1* | 11/2014 | Yang | H05K 5/0047 361/709 |
| 2014/0347817 A1* | 11/2014 | Joshi | H05K 7/20927 361/699 |
| 2015/0062825 A1* | 3/2015 | Ossimitz | H01L 21/4882 361/719 |
| 2015/0156927 A1* | 6/2015 | Tsuboi | H05K 7/20854 361/704 |
| 2015/0216088 A1* | 7/2015 | Kawai | H05K 1/0203 361/710 |
| 2015/0274197 A1* | 10/2015 | Saito | B62D 5/0406 318/400.29 |
| 2016/0255745 A1* | 9/2016 | Govindassamy | H05K 7/1432 |

\* cited by examiner

ELECTRONIC CONTROL UNIT

CROSS REFERENCE TO RELATED APPLICATION

This application is based on Japanese Patent Application No. 2015-77729 filed on Apr. 6, 2015, the disclosure of which is incorporated herein by reference.

TECHNICAL FIELD

The present disclosure relates to an electronic control unit.

BACKGROUND

There has been known an electronic control unit in which electronic components including MOSFETs, which receive power and thus generate heat, are mounted on a substrate having an interconnection pattern. An electronic control unit of JP2010-245174A includes a heat sink on one side in a thickness direction of a substrate and a metal cover on the other side. Heat generated by the electronic components is radiated to the heat sink and to the cover.

However, the electronic control unit described in JP2010-245174A employs the metal cover, which thus leads to issues of large weight and high production cost.

SUMMARY

The present disclosure addresses at least one of the above issues. Thus, it is an objective of the present disclosure to provide an electronic control unit capable of reducing weight of the cover while increasing radiation of heat generated by the electronic components.

To achieve the objective of the present disclosure, there is provided an electronic control unit including a substrate, an electronic component, a heat sink, a cover, a heat accumulator, and a screw. A wiring pattern is formed on the substrate. The electronic component is mounted on the substrate, and generates heat upon energization of the electronic component. The heat sink is provided on one side of the substrate in a thickness direction of the substrate. The cover is made of resin, and is provided on the other side of the substrate in the thickness direction of the substrate. The heat accumulator is fixed to a part of the cover on the substrate-side, and is in contact with a surface of the substrate on the cover-side. One end of the screw is connected to the heat sink. A central portion of the screw is inserted through a hole passing through the substrate in its thickness direction. The other end of the screw is connected to the heat accumulator.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Hereinafter, an electronic control unit according to the disclosure is described with reference to the accompanying drawings. In the following embodiments, substantially the same configuration is designated by the same numeral, and duplicated description is omitted.

First Embodiment

Figure 1:
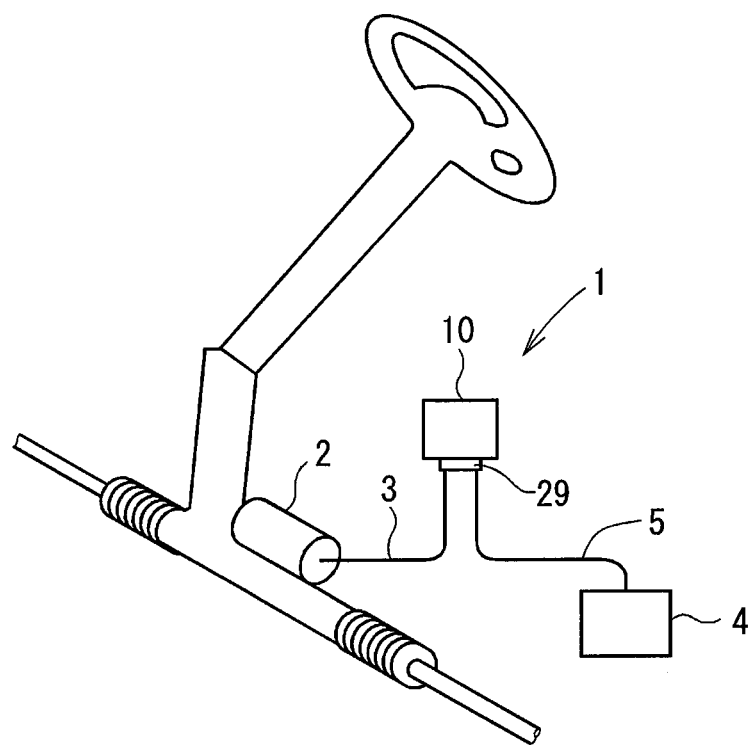
FIG. 1 is a schematic illustration of an electromotive power steering system according to a first embodiment.

A first embodiment is described with reference to FIGS. 1 to 6. In the first embodiment, described is an electronic control unit 10 used in an electromotive power steering system 1 of a vehicle. A configuration of the electromotive power steering system 1 is now described. As illustrated in FIG. 1, the electromotive power steering system 1 includes an electronic control unit 10 that is connected to a motor 2 by a harness 3 and connected to a battery 4 by a harness 5. The electronic control unit 10 controls operation of the motor 2 according to a steering torque signal, a vehicle speed signal, and the like transmitted from a controller area network (CAN) of a vehicle, or the like. Thus, the motor 2 generates assist torque assisting steering by a driver. The motor 2 is a DC brush motor.

Figure 2:
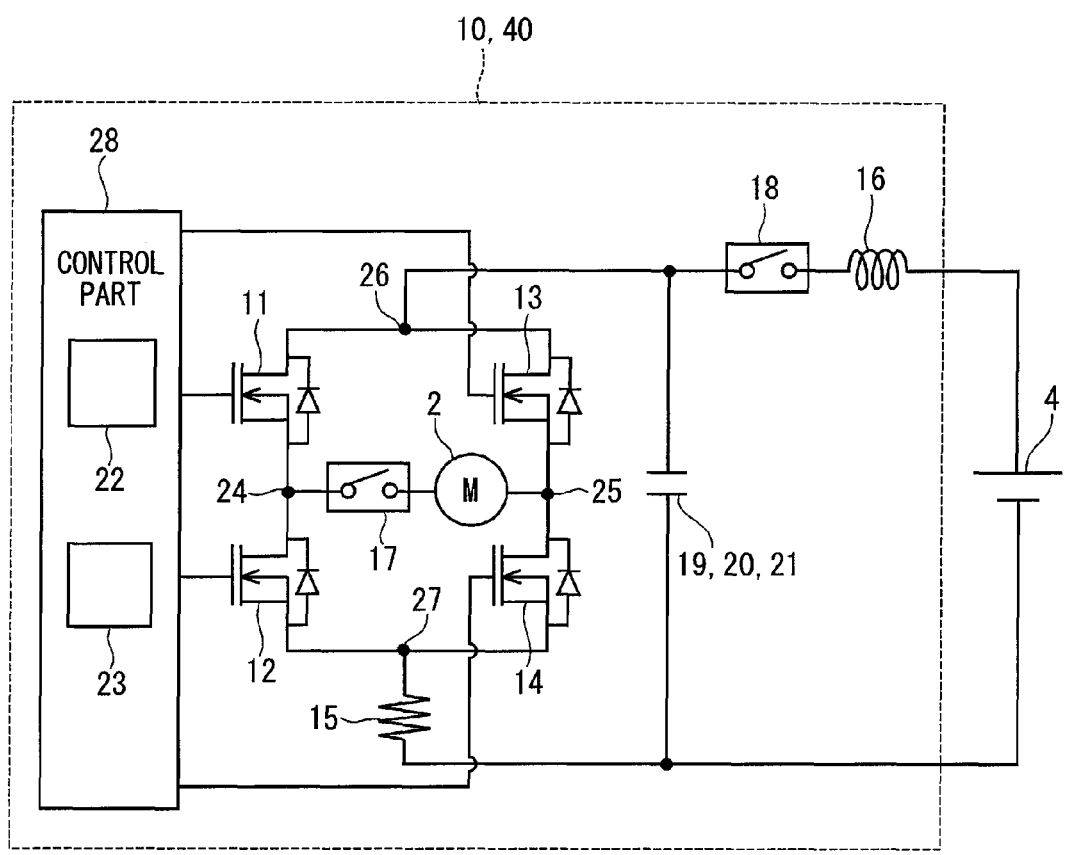
FIG. 2 is a circuit diagram of an electronic control unit of the first embodiment.

A circuit configuration of an electronic control unit 10 is now described. As illustrated in FIG. 2, the circuit of the electronic control unit 10 is configured of electronic components including switching elements 11 to 14, a shunt resistance 15, a coil 16, relays 17 and 18, capacitors 19 to 21, a custom IC 22, and a microcomputer 23. The switching elements 11 to 14 configure an H bridge circuit. Specifically, the two switching elements 11 and 12 connected in series are connected in parallel with the two switching elements 13 and 14 connected in series. A motor relay 17 and a motor 2 are connected in series between a node 24 of a switching element 11 on a high potential side and a switching element 12 on a low potential side and a node 25 of a switching element 13 on the high potential side and a switching element 14 on the low potential side.

A node 26 of the switching element 11 on the high potential side and the switching element 13 on the high potential side is connected to the positive electrode of a battery 4 via the power relay 18 and the coil 16. The coil 16 is, for example, a chalk coil and reduces noise. A node 27 of the switching element 12 on the low potential side and switching element 14 on the low potential side is connected to the negative electrode of the battery 4 via the shunt resistance 15. The shunt resistance 15 is used to detect a current applied to the motor 2. The capacitors 19 to 21 are each, for example, an aluminum electrolytic capacitor, and are connected in parallel with the high-potential-side switching elements 11 and 13 and the low-potential-side switching elements 12 and 14 connected in series. The capacitors 19 to 21 each store electrical charges, and thereby assists power supply to the switching elements 11 to 14, or suppresses noise components such as surge voltage.

A control part 28 is configured of the microcomputer 23 and the custom IC 22. The control part 28 controls ON/OFF operation of each of the switching elements 11 to 14 and the relays 17 and 18 according to signals from sensors provided in various parts of a vehicle, and thereby controls operation of the motor 2.

The configuration of the electronic control unit 10 is now described. As illustrated in FIGS. 3 to 6, the electronic control unit 10 includes a heat sink 30, a substrate 40, the electronic components 11 to 28, a cover 50, nuts 60, and screws 70. The heat sink 30 is formed of metal such as aluminum, and is provided on one side in a thickness direction of the substrate 40. The heat sink 30 has flanges 31 so as to be attached to a vehicle body or the like. The heat sink 30 has recesses 32 concave toward the substrate 40 from its surface on a side opposite to a side close to the substrate 40. A bolt-hole 33 running in a thickness direction of the heat sink 30 is provided in the bottom of each recess 32.

Figure 4:
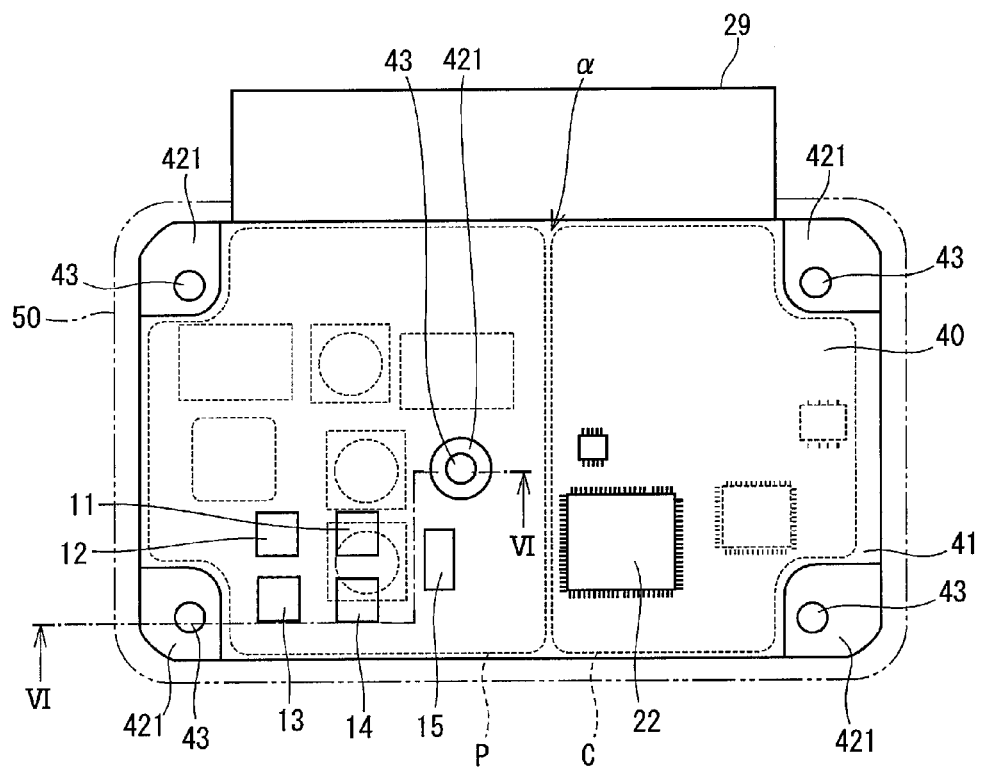
FIG. 4 is a plan view of a substrate in a IV direction in FIG. 3.
Figure 5:
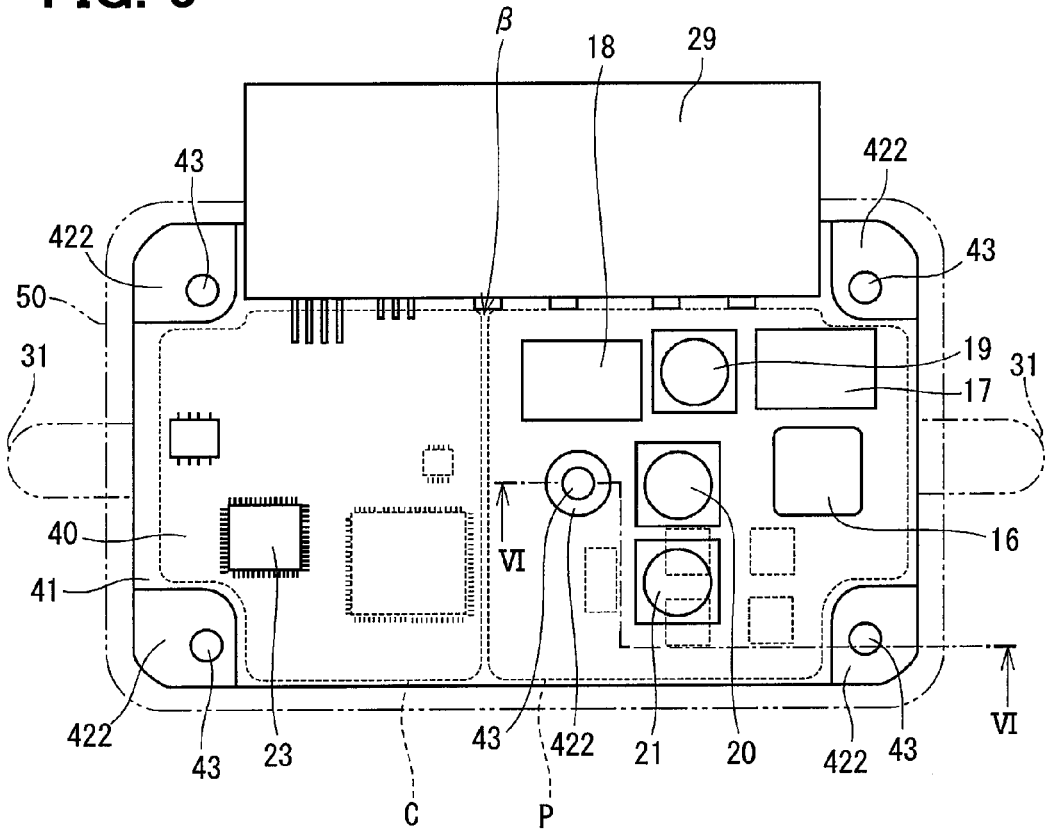
FIG. 5 is a plan view of the substrate in a V direction in FIG. 3.

The substrate 40, such as a FR-4 substrate, has an interconnection pattern on the surface of which a plurality of electronic components 11 to 28 are mounted. In the following description, a first surface α is a surface of the substrate 40 on a side close to the heat sink 30, and a second surface β is a surface of the substrate 40 on a side close to the cover 50. FIG. 4 illustrates the first surface α of the substrate 40. FIG. 5 illustrates the second surface β of the substrate 40. The first surface α and the second surface β of the substrate 40 are each covered with a resin coating 41. Interconnection exposing parts 421 and 422 are each exposed from the resin coating 41 in the four corners and the central portion of the substrate 40. The interconnection exposing part 421 in the first surface α is in contact with the heat sink 30, so that heat, which is generated by the electronic components 11 to 21 receiving power, can be radiated to the heat sink 30. The substrate 40 has holes 43 running in the thickness direction of the substrate 40 in the portions having the interconnection exposing parts 421 and 422.

Four switching elements 11 to 14, the shunt resistance 15, the custom IC 22, and the like are mounted on the first surface α of the substrate 40. In the first embodiment, the switching elements 11 to 14 are each a metal-oxide-semiconductor field-effect transistor (MOSFET). The switching elements 11 to 14 may each be an insulated gate bipolar transistor (IGBT) or the like. An undepicted heat conduction component such as a radiating gel or a radiating sheet may be provided between each of the switching elements 11 to 14 and the heat sink 30. The coil 16, the motor relay 17, the power relay 18, the capacitors 19 to 21, a connector 29, and the microcomputer 23 are mounted on the second surface β of the substrate 40.

A large current flows from the battery 4 to the motor 2 through the electronic components 11 to 21, such as the switching elements 11 to 14, the shunt resistance 15, the coil 16, the motor relay 17, the power relay 18, and the capacitors 19 to 21, which are mounted in a power region P as one of two regions obtained by dividing the substrate 40 in a rectangle length direction. The electronic components such as the custom IC 22 and the microcomputer 23 are mounted in a control region C as the other region of the substrate 40. The power region P is separated from the control region C, thereby the electronic components mounted in the control region C are less affected by the electromagnetic waves emitted from the electronic components mounted in the power region P. The power region P, the control region C, and a layout of the electronic components mounted in each region illustrated in FIGS. 4 and 5 are not limitative and merely shown as an example.

At least one of the switching elements 11 to 14, the shunt resistance 15, the coil 16, the power relay 18, the motor relay 17, and the capacitors 19 to 21 in the first embodiment corresponds to an example of "electronic component". The four switching elements 11 to 14 with the highest calorific value among such electronic components are collectively mounted in the power region P of the first surface α of the substrate 40. The interconnection exposing parts 421 are each provided within the limits of the power region P or in a peripheral region adjacent to the power region P.

Figure 3:
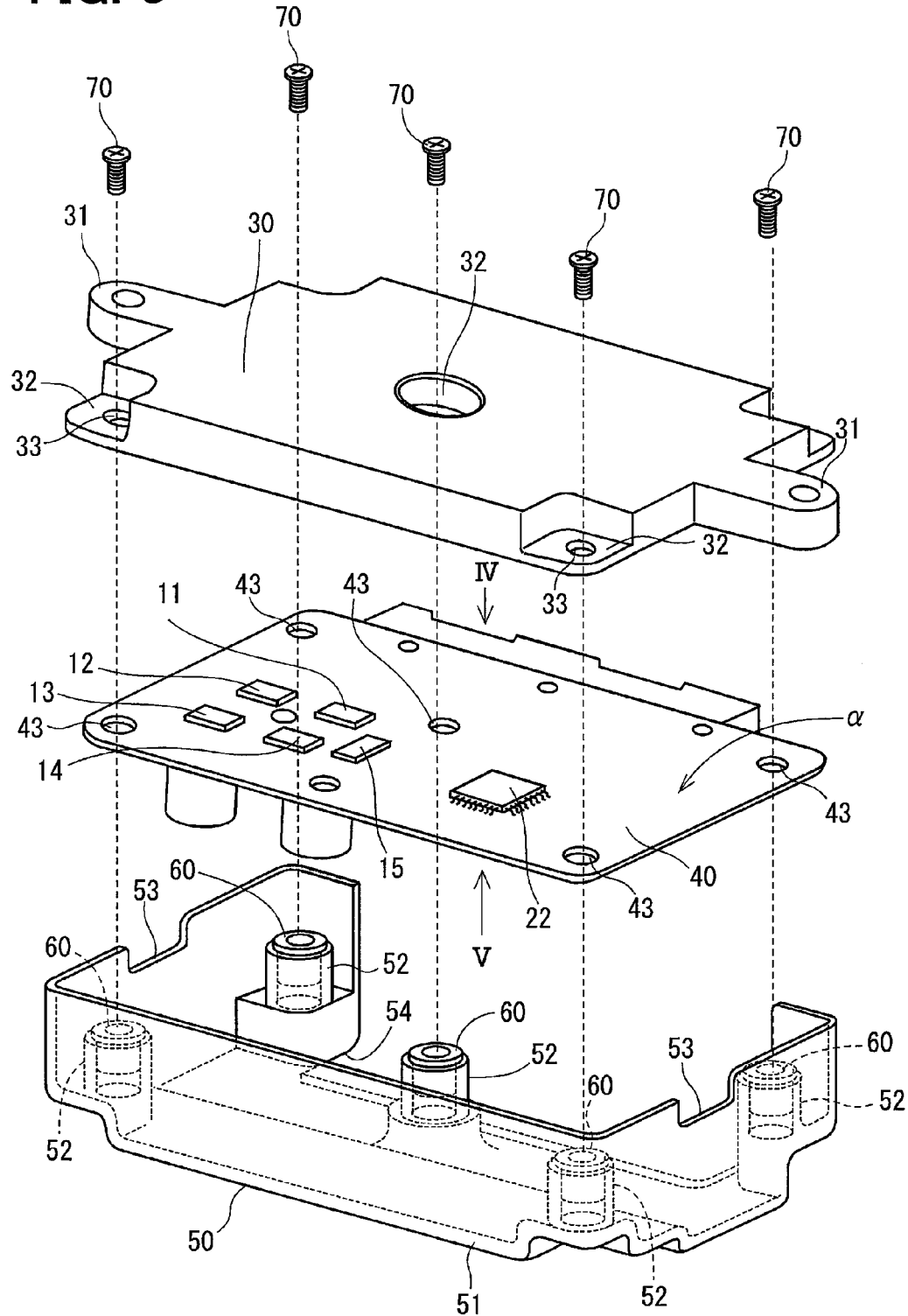
FIG. 3 is an exploded perspective view of the electronic control unit of the first embodiment.
Figure 6:
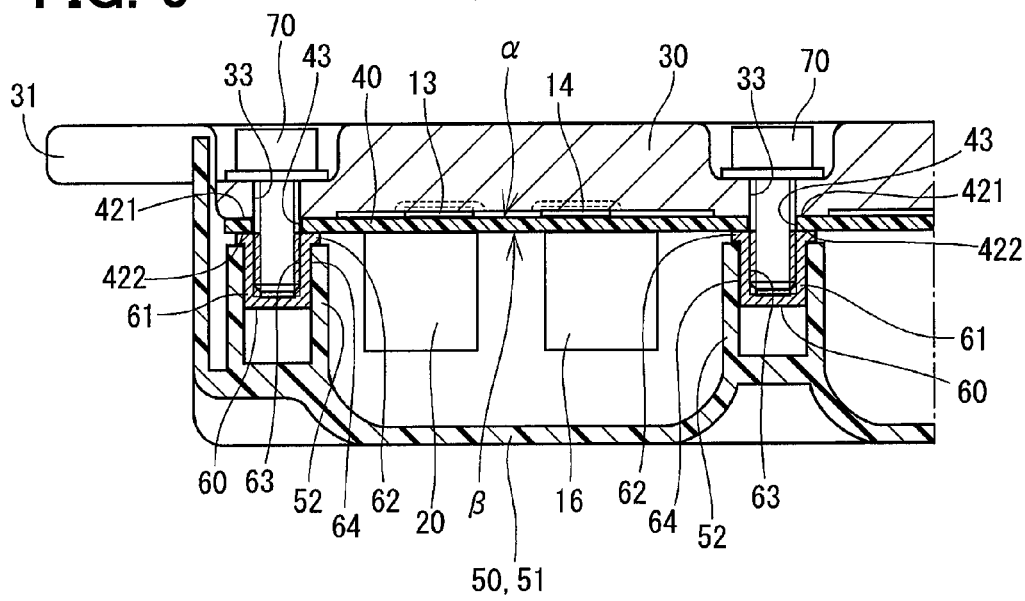
FIG. 6 is a sectional view along a line VI-VI in FIG. 4 or 5.

As illustrated in FIGS. 3 and 6, the cover 50 made of resin or the like is provided on one side in the thickness direction of the substrate 40. The cover 50 includes a cover body 51 having a closed-end cylindrical shape and covering the substrate 40, and cylinder parts 52 provided inside the cover body 51 while extending from the inner wall of the cover body 51 toward the substrate 40. The cover body 51 has cutouts 53 at portions interfering with the flanges 31 of the heat sink 30. The cover 50 further includes an opening 54 in a portion where the connector 29 is provided. The cylinder parts 52 are provided at portions corresponding to the interconnection exposing parts 421 and 422 of the substrate 40. Each nut 60 is fixed to the radially inside of each cylinder part 52.

The nut 60, made of metal, serves as a heat accumulator having a predetermined heat capacity. Specifically, the nut 60 in the first embodiment corresponds to an example of "heat accumulator". The nut 60 includes a press-fitting part 61 to be thermally press-fitted in the inside of the cylinder part 52, and a contact part 62 exposed from the cylinder part 52 on a side close to the substrate 40 of the press-fitting part 61. The nut 60 interiorly includes a female screw 63. Knurling 64 is provided on a radially outer wall of the press-fitting part 61. The nut 60 is thermally press-fitted in the inside of the cylinder part 52. The thermal press-fitting is a method of pressing the press-fitting part 61 into the inside of the cylinder part 52 while the inner wall of the cylinder part 52 is melted by the heated press-fitting part 61 of the nut 60. This method suppresses cracking of the wall of the cylinder part 52, and allows tight contact between the knurling 64 and the inner wall of the cylinder part 52. The contact part 62 of the nut 60 is in contact with the interconnection exposing part 422 of the second surface β of the substrate 40. The contact part 62 has an outer diameter larger than the outer diameter of the press-fitting part 61. Consequently, the contact part 62 of the nut 60 can enlarge the contact area between the nut 60 and the interconnection exposing part 422 of the second surface β.

The screw 70 is made of metal, for example. The screw 70 is inserted from a heat sink 30 side, passes through the bolt hole 33 of the heat sink 30 and the hole 43 of the substrate 40, and is threadably fitted in the female screw 63 of the nut 60. Specifically, the screw 70 has one end connected to the heat sink 30, a central portion inserted through the hole 43 running in the thickness direction of the substrate 40, and the other end connected to the nut 60. Consequently, the heat sink 30, the substrate 40, and the cover 50 are fixed to one another. As a result, the interconnection exposing part 421 of the first surface α of the substrate 40 is securely in contact with the heat sink 30, and the interconnection exposing part 422 of the second surface β of the substrate 40 is securely in contact with the contact part 62. Consequently, heat generated by the electronic components such as the switching elements 11 to 14 is radiated through a first path that transfers the heat from the electronic components to the nut 60 via the interconnection exposing part 422 of the second surface β of the substrate 40 and the screw 70, and radiated through a second path that transfers the heat from the electronic components to the heat sink 30 directly or via the interconnection exposing part 421 and the like.

The electronic control unit 10 of the first embodiment exhibits the following functions and effects. (1) In the first embodiment, the nut 60 fixed to the resin cover 50 is in contact with the interconnection exposing part 422 of the second surface β of the substrate 40. The screw 70 has one end connected to the heat sink 30, the central portion inserted through the hole 43 provided in the substrate 40, and the other end connected to the nut 60. Consequently, heat generated by the electronic components 11 to 21 including the switching elements 11 to 14 is radiated to the heat sink 30 and the nut 60 through the first path and the second path. The electronic control unit 10 therefore can improve radiation performance of the electronic components 11 to 21. Furthermore, the electronic control unit 10 has the cover 50 made of resin, leading to light weight and low production cost.

(2) In the first embodiment, the screw 70 is inserted from a heat sink 30 side, and is threadably fitted in the female screw 63 of the nut 60. Consequently, the nut 60 for attaching the cover 50 to the substrate 40 and the heat sink 30 can be used as the heat accumulator for radiating the heat generated by the electronic components 11 to 21.

(3) In the first embodiment, the nut 60 is fixed to the radially inside of the cylinder part 52 of the cover 50 by thermal press-fitting. This suppresses the cracking of the wall surface of the cylinder part 52 due to press-fitting of the nut 60. It is therefore possible to thin the wall of the cylinder part 52. Consequently, the cylinder part 52 is formed to have a small diameter, and the interconnections or the electronic components 11 to 21 are disposed around the cylinder part 52, thereby size of the electronic control unit 10 can be reduced.

Second Embodiment

Figure 7:
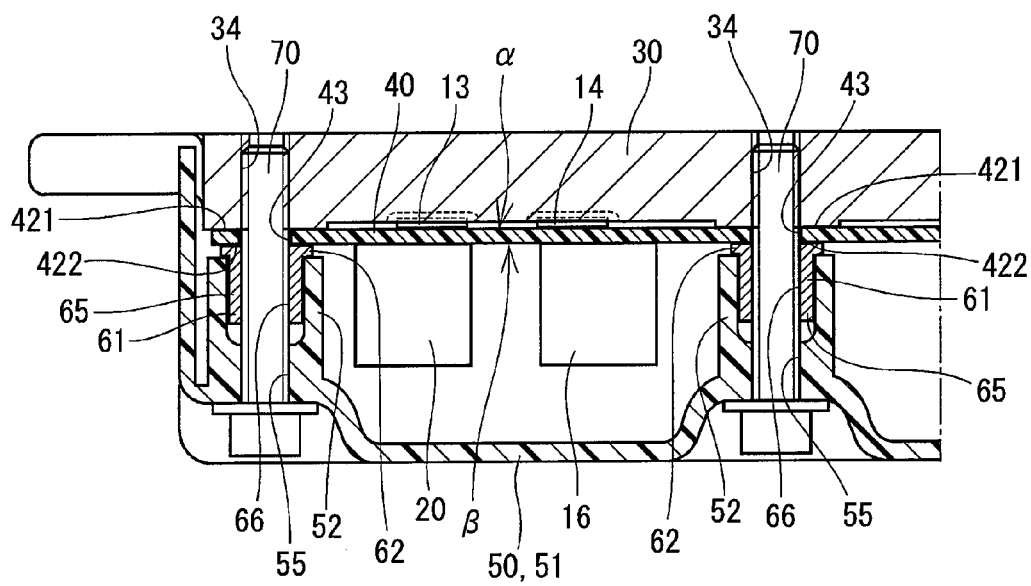
FIG. 7 is a partial section view of an electronic control unit of a second embodiment.

A second embodiment is shown in FIG. 7. In the second embodiment, a cylindrical metal chip 65 is fixed to the inside of the cylinder part 52 of the cover 50. The metal chip 65 serves as a heat accumulator having a predetermined heat capacity. In other words, the metal chip 65 in the second embodiment also corresponds to an example of "heat accumulator". The metal chip 65 includes a press-fitting part 61 to be thermally press-fitted in the inside of the cylinder part 52, and a contact part 62 exposed from the cylinder parts 52 on a side close to the substrate 40 of the press-fitting part 61. The metal chip 65 further includes a hole 66 through which the screw 70 is inserted.

The screw 70 is inserted from a cover 50 side, passes through a hole 55 provided in the cover 50, the hole 66 of the metal chip 65, and the hole 43 of the substrate 40, and is threadably fitted in a female screw 34 provided in the heat sink 30. Consequently, the heat sink 30, the substrate 40, and the cover 50 are fixed to one another. As a result, the interconnection exposing part 421 of the first surface α of the substrate 40 is in contact with the heat sink 30, and the interconnection exposing part 422 of the second surface β of the substrate 40 is in contact with the metal chip 65. Consequently, heat generated by the electronic components such as the switching elements is radiated through a first path that transfers the heat from the electronic components to the metal chip 65 via the interconnection exposing part 422 of the second surface β of the substrate 40 and the screw 70, and radiated through a second path that transfers the heat from the electronic components to the heat sink 30 directly or via the interconnection exposing part 421 of the first surface α of the substrate 40. In the second embodiment, the heat accumulator fixed to the cover 50 may include not only the nut 60 described in the first embodiment, but also the metal chip 65 having one of various shapes.

Third Embodiment

Figure 8:
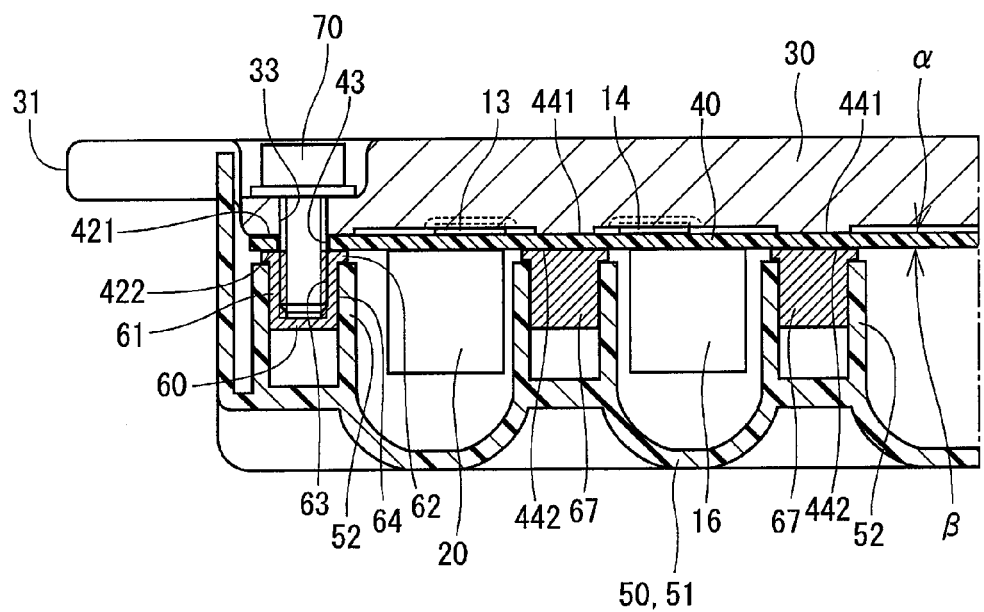
FIG. 8 is a partial section view of an electronic control unit of a third embodiment.
Figure 9:
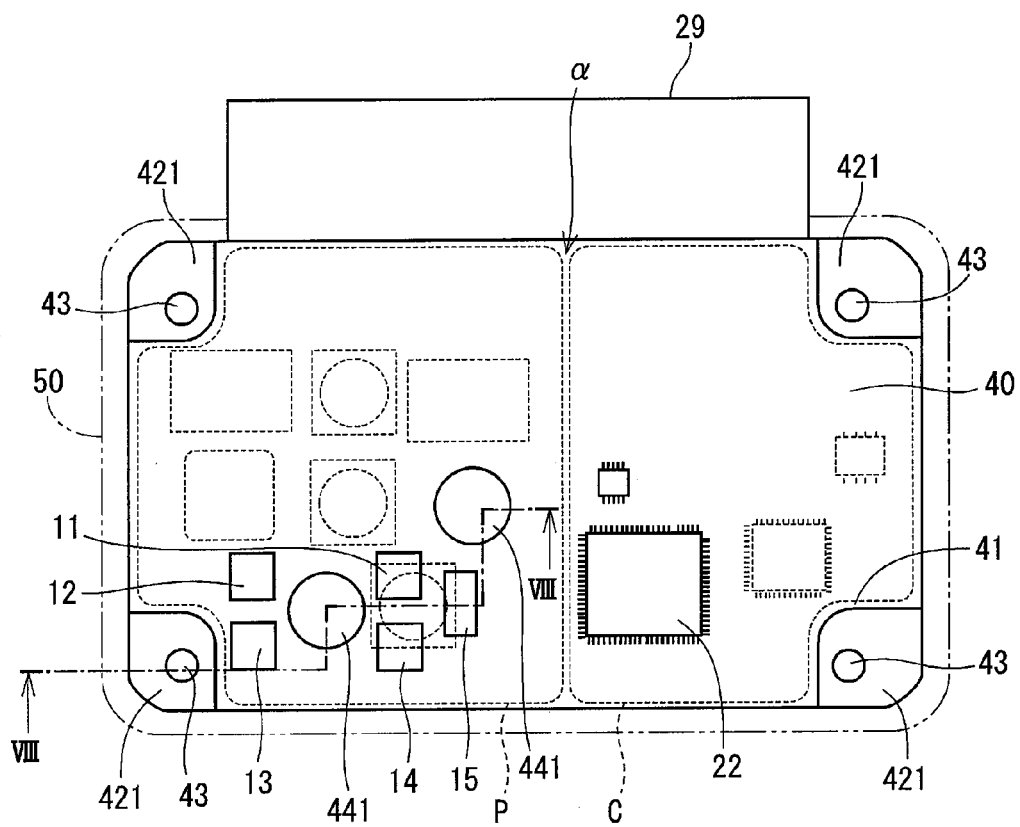
FIG. 9 is a plan view of a substrate of the electronic control unit of the third embodiment.
Figure 10:
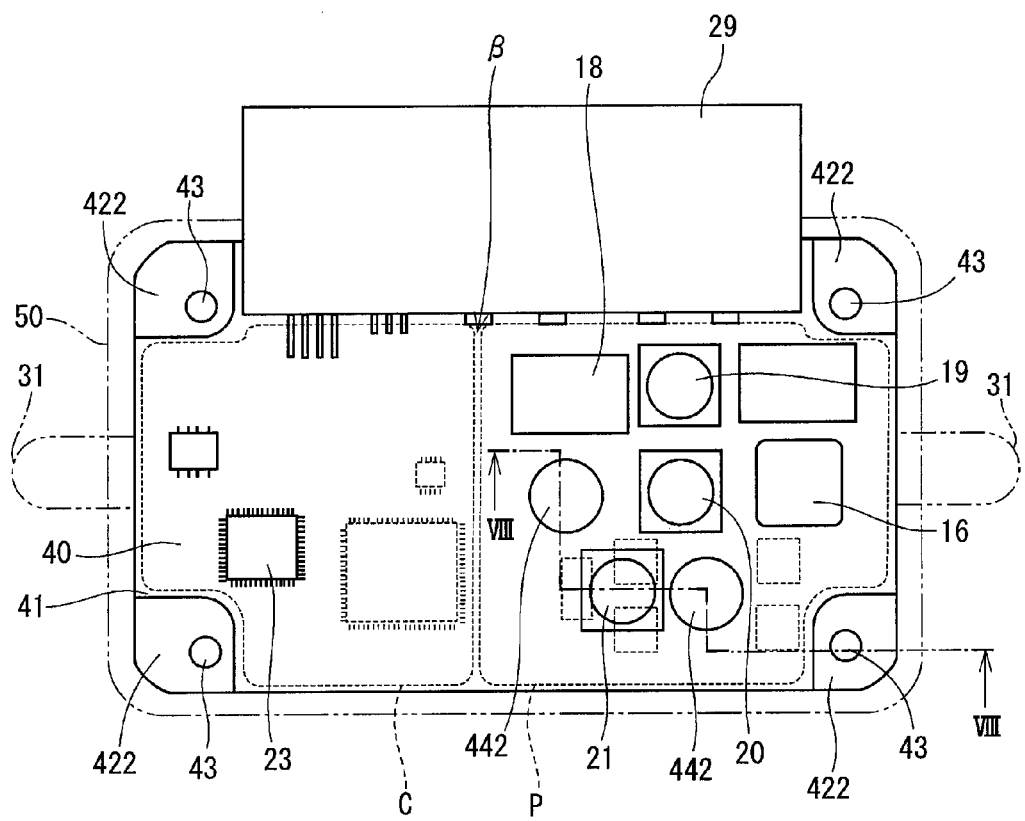
FIG. 10 is a plan view of the substrate of the electronic control unit of the third embodiment.

A third embodiment is shown in FIGS. 8 to 10. In the third embodiment, the interconnection exposing parts 421 and 422 are provided around the respective holes 43 in the four corners of the substrate 40, and furthermore interconnection exposing parts 441 and 442 are each provided at the center of the four switching elements 11 to 14 mounted on the substrate 40 or at a position adjacent to the switching elements 11 to 14. In the third embodiment, the interconnection exposing parts provided around the respective holes 43 in the four corners of the substrate 40 are referred to as first interconnection exposing parts 421 and 422, and the interconnection exposing parts provided adjacent to the four switching elements 11 to 14 within the limits of the power region P of the substrate 40 are referred to as second interconnection exposing parts 441 and 442. Each of the second interconnection exposing parts 441 and 442 has no hole for insertion of the screw 70.

In the third embodiment, the nut 60 is fixed to the cylinder part 52 of the cover 50 at a position corresponding to the first interconnection exposing part 422, and a metal chip 67 is fixed thereto at a position corresponding to the second interconnection exposing part 442. The metal chip 67 in the third embodiment has no hole for insertion of the screw 70. The nut 60 in the third embodiment corresponds to an example of "first heat accumulator". The metal chip 67 in the third embodiment corresponds to an example of "second heat accumulator".

In the electronic control unit 10 of the third embodiment, the nuts 60 and the metal chips 67 are fixed to the cover 50. This increases the number of the nuts 60 and the metal chips 67 that each serve as a heat accumulator, and in turn improves radiation performance of the electronic control unit 10.

In the third embodiment, the second interconnection exposing parts 441 and 442 are each disposed between the four switching elements 11 to 14, or at a position adjacent to the four switching elements. Consequently, the electronic control unit 10 can quickly radiate heat, which is generated by the switching elements 11 to 14, from the second interconnection exposing part 442 to the metal chip 67. It is therefore possible to improve the radiation performance of the electronic control unit 10.

Modifications to the above first to third embodiments will be described below. (1) In the above-described embodiments, the nut 60 is thermally press-fitted in the cylinder part 52 of the cover 50. In a modification, the nut 60 may be fixed to the cylinder part 52 of the cover 50 by press-fitting or adhesion, or may be fixed to the cover 50 by insert molding. Since the wall of the cylinder part 52 can also be thinned by insert molding, size of the electronic control unit 10 can also be reduced thereby.

(2) In the above-described embodiments, the switching elements 11 to 14 and the custom IC 22 are mounted on the first surface α of the substrate 40, while the capacitors 19 to 21, the coil 16, and the relays 17 and 18 are mounted on the second surface β. In a modification, the electronic components such as the switching elements 11 to 14, the custom IC 22, the capacitors 19 to 21, the coil 16, and the relays 17 and 18 may be mounted on either of the first surface α and the second surface β of the substrate 40.

(3) In the above-described embodiments, the electronic control unit 10 includes the power relay 18 and the motor relay 17 that are each a mechanical relay. In a modification, the electronic control unit 10 may include a semiconductor switching element such as MOSFET or IGBT as at least one of the power relay 18 and the motor relay 17.

(4) In the above-described embodiments, the electronic control unit 10 includes the H bridge circuit configured of the four switching elements 11 to 14 and drives the DC motor 2 thereby. In a modification, the electronic control unit 10 may include an inverter circuit configured of, for example, six switching elements to drive a brushless motor.

(5) In the above-described embodiments, described is the electronic control unit 10 that is provided at a position away from the motor 2 of the electromotive power steering system 1 and controls the motor 2. In a modification, the electronic control unit 10 may be provided integrally with the motor 2. Furthermore, in a modification, the electronic control unit 10 should not limitedly control the electromotive power steering system 1, and may control various other systems. As described above, the present disclosure is not limited to the above-described embodiments, and can be carried out in various modes within the scope without departing from the gist of the disclosure.

To sum up, the electronic control unit 10 of the above embodiments can be described as follows.

An electronic control unit 10 includes a substrate 40, an electronic component 11-21, a heat sink 30, a cover 50, a heat accumulator 60, 65, 67, and a screw 70. A wiring pattern is formed on the substrate 40. The electronic component 11-21 is mounted on the substrate 40, and generates heat upon energization of the electronic component 11-21. The heat sink 30 is provided on one side α of the substrate 40 in a thickness direction of the substrate 40. The cover 50 is made of resin, and is provided on the other side β of the substrate 40 in the thickness direction of the substrate 40. The heat accumulator 60, 65, 67 is fixed to a part of the cover 50 on the substrate 40-side, and is in contact with the substrate 40. One end of the screw 70 is connected to the heat sink 30. A central portion of the screw 70 is inserted through a hole 43 provided for the substrate 40. The other end of the screw 70 is connected to the heat accumulator 60, 65, 67.

Consequently, the heat generated by the electronic components 11-21 is radiated through a first path that transfers the heat from the electronic components 11-21 to the heat accumulator 60, 65, 67 via the substrate 40 and the screw 70, and radiated through a second path that transfers the heat from the electronic components 11-21 to the heat sink 30 directly or via the substrate 40. The electronic control unit 10 therefore can improve radiation performance of the electronic components 11-21. Furthermore, the electronic control unit 10 has a resin cover 50, leading to lightweight and low production cost.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An electronic control unit comprising:
   a substrate on which a wiring pattern is formed;
   an electronic component that is mounted on the substrate and generates heat upon energization of the electronic component;
   a heat sink that is provided on one side of the substrate in a thickness direction of the substrate;
   a cover that is made of resin and is provided on the other side of the substrate in the thickness direction of the substrate;
   a heat accumulator that is fixed to a part of the cover on the substrate-side of the cover and is in contact with a surface of the substrate on the cover-side of the substrate; and
   a screw, wherein:
      one end of the screw is connected to the heat sink;
      a central portion of the screw is inserted through a hole passing through the substrate in its thickness direction; and
      the other end of the screw is connected to the heat accumulator.

2. The electronic control unit according to claim 1, wherein:
   the substrate includes an interconnection exposing part that is exposed on a surface of the substrate; and
   the heat accumulator is in contact with the interconnection exposing part that is exposed on the surface of the substrate on the cover-side.

3. The electronic control unit according to claim 1, wherein the screw is inserted from the heat sink-side to be threadedly engaged with a female screw that is provided for the heat accumulator.

4. The electronic control unit according to claim 1, wherein:
   the heat accumulator includes a hole through which the screw is inserted; and
   the screw is inserted from the cover-side to be threadedly engaged with a female screw that is provided for the heat sink.

5. The electronic control unit according to claim 1, wherein:
   the substrate includes:
      a first interconnection exposing part that is exposed around the hole of the substrate; and
      a second interconnection exposing part that is exposed on a surface of the substrate at a position different from the first heat accumulator; and
   the heat accumulator includes:
      a first heat accumulator that is in contact with the first interconnection exposing part; and
      a second heat accumulator that is in contact with the second interconnection exposing part.

6. The electronic control unit according to claim 5, wherein:
   the electronic component is one of a plurality of electronic components; and
   the second interconnection exposing part is disposed between the plurality of electronic components.

7. The electronic control unit according to claim 1, wherein:
   the cover includes:
      a cover body that covers the substrate; and a cylinder part that extends from an inner wall of the cover body toward the substrate; and the heat accumulator is fixed to radially inside of the cylinder part by thermal press-fitting.

8. The electronic control unit according to claim 1, wherein:

the cover includes
a cover body that covers the substrate; and
a cylinder part that extends from an inner wall of the cover body toward the substrate; and the heat accumulator is fixed to radially inside of the cylinder part by insert molding.

9. The electronic control unit according to claim 1, wherein the electronic component includes at least any one of a switching element, a shunt resistance, a coil, a relay, and a capacitor.

* * * * *